(12) United States Patent
Kramer et al.

(10) Patent No.: US 9,337,374 B2
(45) Date of Patent: May 10, 2016

(54) HIGH PRODUCTIVITY SPRAY PROCESSING FOR THE METALLIZATION OF SEMICONDUCTOR WORKPIECES

(71) Applicant: SOLEXEL, INC., Milpitas, CA (US)

(72) Inventors: Karl-Josef Kramer, San Jose, CA (US); Jay Ashjaee, Los Gatos, CA (US); Mehrdad M. Moslehi, Los Altos, CA (US); Anthony Calcaterra, Milpitas, CA (US); David Dutton, Milpitas, CA (US); Pawan Kapur, Palo alto, CA (US); Sean Seutter, San Jose, CA (US); Homi Fatemi, Milpitas, CA (US)

(73) Assignee: Solexel, Inc., Milpitas, CA (US)

( * ) Notice: Subject to any disclaimer, the term of this patent is extended or adjusted under 35 U.S.C. 154(b) by 271 days.

(21) Appl. No.: 13/726,169

(22) Filed: Dec. 23, 2012

(65) Prior Publication Data

US 2014/0033971 A1    Feb. 6, 2014

Related U.S. Application Data

(60) Provisional application No. 61/579,819, filed on Dec. 23, 2011, provisional application No. 61/638,474, filed on Apr. 25, 2012.

(51) Int. Cl.
*B05C 11/00* (2006.01)
*H01L 31/18* (2006.01)
*H01L 31/05* (2014.01)
*C23C 4/00* (2016.01)
*C23C 4/12* (2016.01)

(52) U.S. Cl.
CPC ............... *H01L 31/18* (2013.01); *C23C 4/005* (2013.01); *C23C 4/12* (2013.01); *H01L 31/0516* (2013.01); *H01L 31/188* (2013.01); *Y02E 10/50* (2013.01)

(58) Field of Classification Search
None
See application file for complete search history.

(56) References Cited

U.S. PATENT DOCUMENTS 4,911,353 A   3/1990 Deakin
5,082,542 A * 1/1992 Moslehi et al. .......... 204/192.32
(Continued)

FOREIGN PATENT DOCUMENTS

JP    2001-15447 A    1/2001
KR    10-2004-0017787 A    2/2004
(Continued)

OTHER PUBLICATIONS

PCT International Search Report and Written Opinion dated Apr. 29, 2013 issued in PCT/US2012/071561.
(Continued)

*Primary Examiner* — Dah-Wei D Yuan
*Assistant Examiner* — Jethro M Pence
(74) *Attorney, Agent, or Firm* — John Wood

(57) ABSTRACT

Processing equipment for the metallization of a plurality of semiconductor workpieces. A controlled atmospheric non-oxidizing gas region comprises at least two enclosed deposition zones, the controlled atmospheric non-oxidizing gas region is isolated from external oxidizing ambient. A temperature controller adjusts the temperature of the semiconductor workpiece in each of the at least two enclosed deposition zones. Each of the enclosed deposition zones comprising at least one spray gun for the metallization of the semiconductor workpiece. A transport system moves the semiconductor workpiece through the controlled atmospheric non-oxidizing gas region. A batch carrier plate carries the semiconductor workpiece through the controlled atmospheric non-oxidizing gas region. The controlled atmospheric non-oxidizing gas region further comprises a gas-based pre-cleaning zone.

10 Claims, 11 Drawing Sheets

(56) References Cited

U.S. PATENT DOCUMENTS

| | | | |
|---|---|---|---|
| 6,695,030 | B1 | 2/2004 | Phillips et al. |
| 2007/0163494 | A1* | 7/2007 | Tokie et al. .................... 118/301 |
| 2008/0038908 | A1 | 2/2008 | Henley |
| 2012/0067281 | A1* | 3/2012 | Suzuki .......................... 118/708 |
| 2014/0238463 | A1 | 8/2014 | Nese et al. |

FOREIGN PATENT DOCUMENTS

| | | |
|---|---|---|
| KR | 10-2005-0038121 A | 4/2005 |
| KR | 10-2008-0074552 A | 8/2008 |
| KR | 10-2009-0029224 A | 3/2009 |
| KR | 10-2011-0004873 A | 1/2011 |
| KR | 10-2011-0062857 A | 6/2011 |
| WO | WO 2010-131365 * 11/2010 ............. B05C 11/00 |
| WO | WO/2011/019828 | 2/2011 |
| WO | WO/2013/0906951 | 6/2013 |

OTHER PUBLICATIONS

PCT International Preliminary Report on Patentability dated Jun. 24, 2014 issued in PCT/US2012/071561.

* cited by examiner

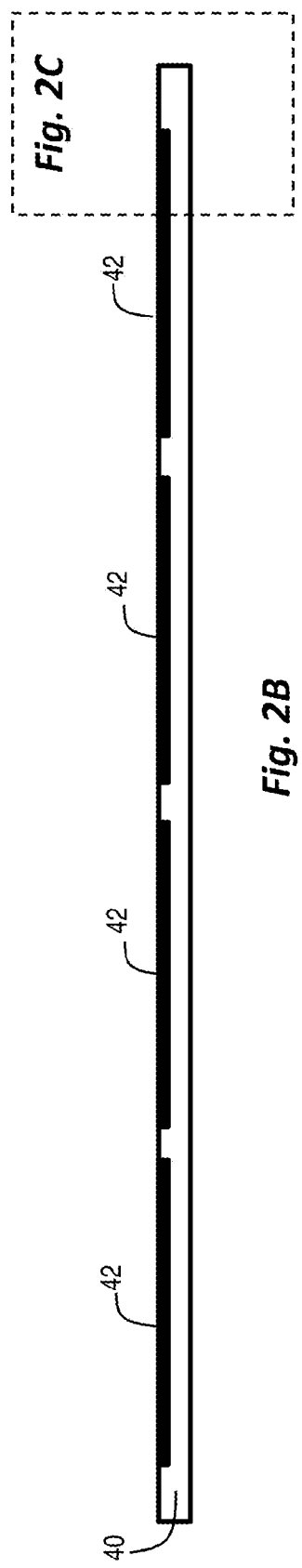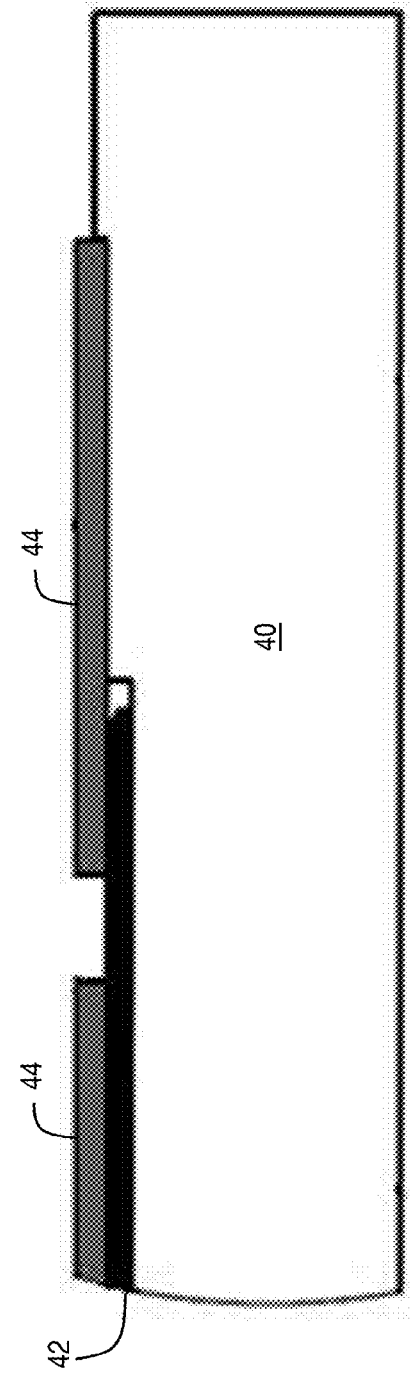

HIGH PRODUCTIVITY SPRAY PROCESSING FOR THE METALLIZATION OF SEMICONDUCTOR WORKPIECES

CROSS-REFERENCE RELATED APPLICATIONS

This application claims the benefit of provisional patent application 61/579,819 filed on Dec. 23, 2011, which is hereby incorporated by reference in its entirety.

This application also claims the benefit of provisional patent application 61/638,474 filed on Apr. 25, 2012, which is hereby incorporated by reference in its entirety.

FIELD OF THE INVENTION

The present disclosure relates in general to the field of electrical metallization and interconnects formed by spray processing, and more particularly to the field of electrical metallization and interconnects formed by spray processing for semiconductor and photovoltaic devices.

BACKGROUND

Fabrication of electrical interconnects and contacts, also called metallization, is performed by a variety of known methods such as electroless and/or electro plating, sputtering, ion beam deposition, evaporation, screen printing, stencil printing, inkjet printing, aerosol jet printing, and/or chemical-vapor deposition (CVD). To efficiently extract electrical power generated from exposure to sunlight, solar cells require low-loss electrical interconnects and contacts to the cell electrical terminals (emitter and base regions). These methods, though sufficient for the formation of certain metallization designs, may be costly, particularly for applications in high-efficiency solar cell architectures, because of one or a combination of the following aspects:

Equipment capital cost and complexity—metallization fabrication equipment and methods are often costly and the processing may be rather complex, particularly for vacuum deposition methods such as physical vapor deposition (PVD) processes (including plasma sputtering, ion beam deposition, and evaporation methods), which may require relative low base pressures and high vacuum environment;

Material utilization—known methods may suffer from relatively low utilization of the primary raw metallization materials for metallization resulting in additional metallization materials required and a higher cost of raw materials used, for example vacuum deposition techniques such as plasma sputtering with finite target material utilization; and Cost of consumables—these materials include the fabrication materials or consumables other than the primary raw materials, such as chemicals, filters, regeneration of resins used in plating methods, and the cost of manufacturing metal targets used in plasma sputtering technique.

Atmospheric-pressure thermal and/or arc spraying of metals is a cost-effective method to coat surfaces with specific metals that has been used in a variety of industries, primarily for structural and corrosion-resistance coating applications. While the use of metal spraying technology to form electrical interconnects and metallization contacts on traditional front-contact solar cells has been proposed as early as 1982, complications arising from various factors such as relatively high electrical resistivity of the deposited metal (i.e., much higher resistivity compared to bulk resistivity of the material being deposited) due to porosity and oxidation of the deposited material layer (since deposition occurs in oxidizing air ambient), as well as the adverse effects of impinging high-temperature molten metal directly onto the exposed semiconductor solar cells, such as the direct reaction of hot metal droplets with the semiconductor layer (leading to the killer shunts in the solar cells), as well as the need for fine metallic patterns has prevented the development and commercialization of automated high-productivity spray processing equipment in solar cell manufacturing applications. Most common silicon based solar cells are structured using a single layer metal for each of the contacts and using sprayed metals, especially in an oxidizing ambient, present significant challenges for forming ohmic contacts between the sprayed metal and the silicon contact regions in the cell. Further, fine line metallization requirements, often essential in solar cells, are difficult to meet when spraying a single layer of metal using known methods.

Further, the production throughputs of known thermal or arc spray tools are often too low to enable low-cost metallization for solar photovoltaic applications. Moreover, the electrical resistivities of the conductive materials deposited by known thermal or arc spray tools and processes may be significantly higher than the bulk resistivity values of the materials being deposited (typically by at least an order of magnitude or more) due to the uncontrolled air ambient (resulting in oxidation of the hot metal droplets in air as well as incorporation of other impurities in the droplets), micro-voids, and the porosity of the deposited layers. As a result, for a specified maximum allowable metallization sheet resistance, the required thickness of the metallization material layer is significantly larger than the metal thickness deposited by other methods such as the vacuum PVD techniques. Therefore, a very thick layer (e.g., typically at least from 10's to 100's of microns) of metal would be required to meet the conductivity requirement which may result in relatively high stress, wafer bow, yield and reliability issues, as well as relatively high metallization cost. These factors often make known thermal and arc spray tools and methods unattractive and uneconomical for metallization applications in mass production of microelectronics, solar photovoltaics, and other semiconductor devices.

Additionally, known thermal and arc spray tools and processes may result in very rough surfaces and poor uniformity control for the deposited films and often do not provide any capability for the deposition of in-situ-patterned layers. Thus, patterning of the deposited metal layer often has to be performed by printing of a patterned resist layer such as by screen printing or lithography and subsequent wet chemical etching of a relatively thick rough metal layer—thus resulting in additional manufacturing costs and wastes.

Solar cell developments utilizing the surfaces of a suitable substrate, herewith called a backplane, attached to a thin-film (or ultrathin) crystalline solar cell (for example having a crystalline silicon layer thickness of range of about 1 micron up to less than 100 microns) have necessitated the need for and may highly benefit from an automated high-productivity processing equipment using thermal and/or arc spray metallization applications.

SUMMARY

Therefore, a need has arisen for high productivity spray processing equipment for the metallization of a plurality of workpieces. In accordance with the disclosed subject matter spray processing equipment for the metallization of a plurality of workpieces are provided which substantially eliminate or reduces disadvantage associated with previously developed high productivity workpiece metallization systems.

According to one aspect of the disclosed subject matter, processing equipment for the metallization of a plurality of semiconductor workpieces is provided. A controlled atmospheric non-oxidizing gas region comprises at least two enclosed deposition zones, the controlled atmospheric non-oxidizing gas region is isolated from external oxidizing ambient. A temperature controller adjusts the temperature of the semiconductor workpiece in each of the at least two enclosed deposition zones. Each of the enclosed deposition zones comprising at least one spray gun for the metallization of the semiconductor workpiece. A transport system moves the semiconductor workpiece through the controlled atmospheric non-oxidizing gas region. A batch carrier plate carries the semiconductor workpiece through the controlled atmospheric non-oxidizing gas region. The controlled atmospheric non-oxidizing gas region further comprises a gas-based precleaning zone.

In another embodiment, the processing equipment further comprises a shadow mask exposing and defining a metallization pattern on the semiconductor workpiece. In yet another embodiment, the shadow mask is a discrete patterned mask positioned on the semiconductor workpiece. In yet another embodiment, the shadow mask is a discrete patterned mask positioned on the semiconductor workpiece and further comprising an integrated mask cleaning system. In yet another embodiment, the shadow mask are strips arranged in a continuous strips arrangement. In yet another embodiment, the shadow mask are strips arranged in a roll-to-roll arrangement. In yet another embodiment, the shadow mask are strips arranged in a continuous strips arrangement and further comprising a continuous strips arrangement. In yet another embodiment, the controlled atmospheric non-oxidizing gas region comprises at least three enclosed deposition zones.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of any claims.

BRIEF DESCRIPTION OF THE DRAWINGS

For a more complete understanding of the disclosed subject matter and advantages thereof, reference is now made to the following brief descriptions set forth below when taken in conjunction with the accompanying drawings in which like reference numbers indicate like features and wherein:

FIGS. 2A-C are diagrams showing an example substrate carrier/workpiece/mask assembly;

DETAILED DESCRIPTION

Figure 1:
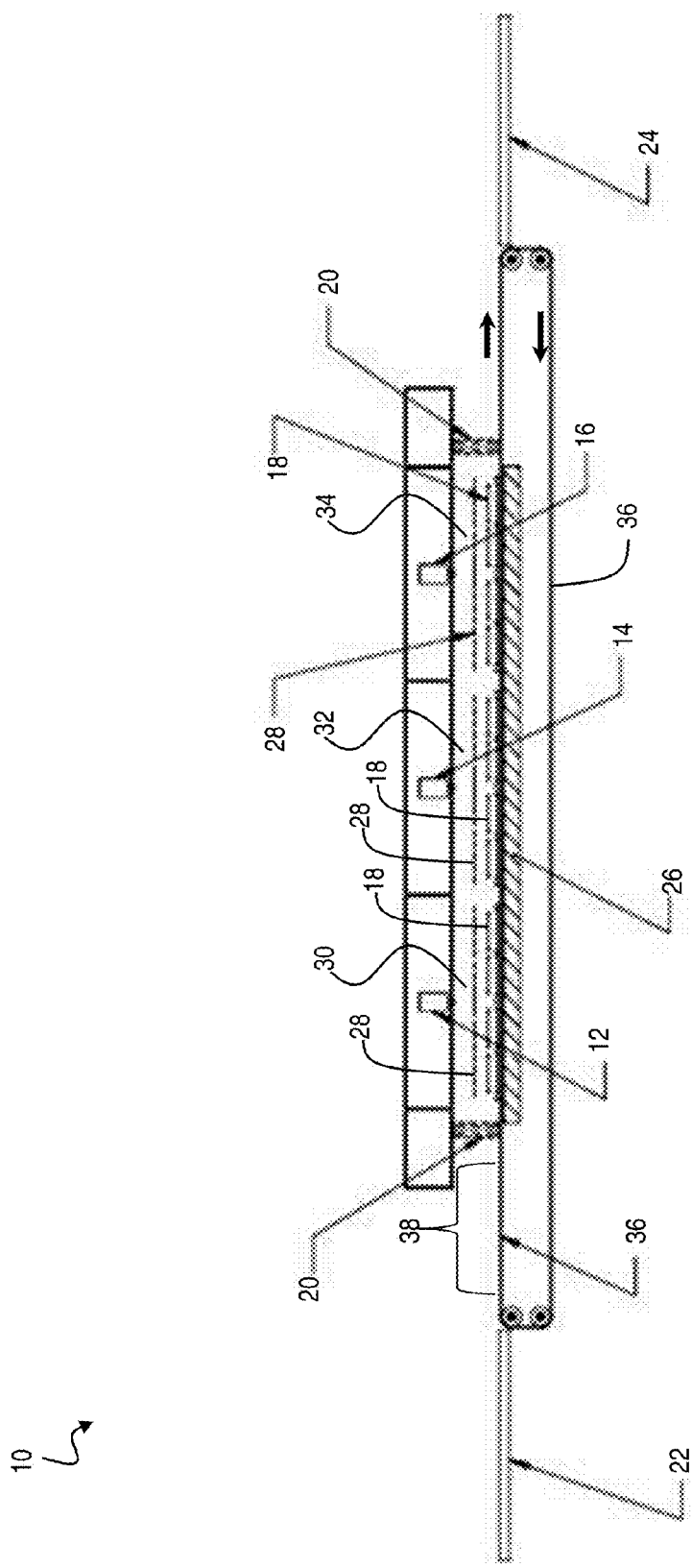
FIG. 1 is a diagram of automated processing equipment for the application or deposition of metal coatings onto a series of substrates.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

Thermal spraying methods may use different metal feedstock while thermal and ARC spraying methods commonly generate and propel molten droplets towards a workpiece to be coated through applied energy. Thermal spraying examples include powder or liquid based sprays where the spray is generated by heating the powder or liquid by sending it through a plasma, and ARC spraying examples include twin wire arc spraying where the spray is generated using an arc between two wires. And although the present disclosure is described with reference to specific embodiments, such as the automated application of metal sprays (thermal and/or arc sprays) to solar cells and solar cell backplanes, one skilled in the art could apply the principles disclosed herein to other types of solar cells and other suitable workpieces, such as electronic substrates, and utilize alternative spraying techniques. For example, while thermal spray primarily uses heating or thermal energy to produce molten droplets to spray on the workpiece, arc spraying uses an arc plasma, such as an arc plasma formed between the tips of a pair of wires (e.g., Twin-Wire Arc Spray or TWAS) using an electrical power source producing an arc discharge in order to form the metal spray. Both the thermal spray and arc spray techniques may be performed under atmospheric pressure conditions, hence eliminating the need for vacuum pumping. Further, both thermal and arc plasma spray (such as TWAS) techniques typically use wire or wires of the material(s) to be deposited on the workpiece as feedstock. In case of spray deposition of an elemental material such as pure aluminum or copper, the wire material is made of the desired elemental material intended for deposition on the workpieces. On the other hand, alloys of a plurality of elemental materials, such as alloy of aluminum and zinc, may be deposited by using alloy wires or by using multiple wires of the various elements which make up the alloy. In the latter case, the relative speeds (and/or diameters) of the different wires may be used to control the composition of the deposited alloy.

The terms workpieces and substrates are used interchangeably herein. For example, a workpiece or a substrate may be a semiconductor substrate used for fabrication of a solar photovoltaic cell and/or module. Further, the metal coating systems disclosed herein may vary depending on the types of metal coating applied, for example patterned or blanket metal coatings, and on the method of workpiece transport into and out of the coating chambers, for example workpiece carriers such as batch wafer trays.

FIG. 1 is a diagram of automated processing equipment for the application metal coatings onto a series of substrates, specifically the application of atmospheric-pressure (or near atmospheric pressure) metal sprays to workpieces carried on substrate carriers, optionally with in-situ masking for patterned deposition of the metallic layers. Automated processing machine 10 provides for the application of up to three patterned metal coatings onto a series of substrates, such as solar cells, positioned on appropriate multi-wafer carriers; however, the disclosed systems may comprise any number of deposition zones (from one up to a specified plurality of deposition zones) for the application of any number of metal coatings, for example up to five layers in some cases. Further, the system of FIG. 1 of may provide controlled ambient thermal spray coating of metallization layers in a controlled non-oxidizing (e.g., inert) or reducing (e.g., hydrogen containing) ambient comprising an inert gas such as nitrogen, and/or hydrogen or forming gas (which, if desired, may also be recovered and recycled).

Automated processing machine 10 comprises spray guns 12, 14, and 16 positioned in deposition zones 30, 32, and 32, respectively, that are sufficiently isolated from external oxidizing ambient air outside the deposition zones to create a controlled gas environment during the spray coating process. The controlled ambient prevents oxidation of the metallic layers being spray deposited, thus enabling deposition of metallic layers with better electrical conductivity properties (closer to their bulk conductivities). Carrier load station 22 may unload work pieces 18, carried in mask carriers, onto conveyor belt 36 which transports work pieces 18 onto optional heating zone 38 and into and through the controlled atmospheric region comprising deposition zones 30, 32, and 32. Isolation gas curtains 20 isolate the controlled-ambient atmospheric region from outside ambient, and vice versa (isolating internal ambient), to create a controlled gas environment with minimal or negligible oxygen content using known techniques commonly deployed in controlled-atmosphere conveyor furnaces and atmospheric-pressure chemical vapor deposition (APCVD) equipment. And temperature controller 26 controls the temperature of the atmospheric region (optionally individually for each deposition zone). Although not shown, each deposition zone may be a fully enclosed region, for example separated by isolation gas curtains. Work pieces 18 pass through deposition zones 30, 32, and 32 where metallization layers are deposited and patterned using masks 28 on work pieces 18, and then out isolation gas curtain 20 and optionally to carrier unload station 24.

For transport through the automated processing equipment, the workpieces may be placed onto a batch tray or batch carrier plate and covered by a patterned shadow masking plate (for example a shadow mask such as a proximity non-contact mask or a contact shadow mask). In one example, a single shadow mask is used for creating either a single-layer or multi-layer spray deposited metal, thus producing a pre-specified patterned metallic layer. And in some embodiments, such as for forming complex spray geometries on a workpiece, different shadow masking plates may be applied and removed from a workpiece throughout subsequent spray processes. Each tray may contain one workpiece or a number of workpieces for enhanced throughput and tool productivity. The trays or carriers are then transported into the spraying zones by an appropriate moving mechanism, such as a conveyor belt 36. Automated carrier load station 22 and carrier unload station 24 may provide loading and unloading of the carriers onto conveyor belt 36.

An optional pre-cleaning component (not shown in the figures) provides substrate cleaning in order to reduce the electrical contact resistance and to improve adhesion between the deposited metal and the substrate, including any underlying metallization pattern if exposed, for example using arc plasma in a reducing ambient (such as a hydrogen containing ambient) or chlorine vapor cleaning zone. Precleaning removes potential metal oxides from regions, such as via holes, where contact is to be made between an already existing metal, such as a first metallization layer (M1) and the metal to be sprayed. Pre-cleaning or oxide removal may be used to obtain low and reliably low contact resistance between the sprayed metal and the material that the sprayed metal is contacting, such as a metal layer 1.

If gas based pre-cleaning is used, the cleaning gases may be applied in one reactor zone. For example, as described with reference to FIG. 1, spray gun 12 may be replaced by an applicator for a cleaning vapor, cleaning gas or cleaning gas mixture, such as a gas nozzle array. In the spray systems described herein, pre-cleaning may be performed in the non-oxidizing ambient and subsequently, while the workpiece remains continuously in the non-oxidizing ambient, the metal spray is applied on the cleaned contact surface—thus the freshly cleaned surface may be protected from being reoxidized prior to spray metal application. Example precleaning gases include, and depending on the metal to be cleaned, halogen containing chemicals such as but not limited to HF, HCl, chlorine, NF3, CF4, SF6 or even hydrogen or forming gas (for example when the workpieces are kept at elevated temperatures).

The controlled gas environment comprising deposition zones 30, 32, and 34 and encapsulated by isolation gas curtains 20, may comprise a non-oxidizing gas environment such as an inert gas environment (e.g., argon, xenon, or helium), nitrogen, or an oxygen and carbon reducing ambient such as forming gas (for example a non-flammable mixture of hydrogen and nitrogen) or pure hydrogen. The use of a non-oxidizing controlled ambient allows for the formation of metallic interconnects with electrical resistivities closer to the ideal bulk resistivity values (e.g., ~2.7 $\mu\Omega$·cm for pure aluminum or ~1.7 $\Omega$·cm for pure copper). Each zone is equipped with one or more metal spraying guns in order to coat the workpieces with specific materials, such as metal 1 spray gun 12 in deposition zone 30 metal 2 spray gun 14 in deposition zone 32, and metal 3 spray gun 16 in deposition zone 34. Shown, up to three different coating materials may be deposited (the metals deposited in different zones may be the same, all different, or a combination) while more metal spray zones (comprising a deposition zone and spray gun) may be utilized for metal stacks with a higher number of layers.

The spraying guns may be stationary, moving, or a combination of stationary and moving. A moving gun(s) may provide uniform coating when the coverage area on the substrate is large and only one (or a few) guns are utilized. Alternatively, for coating a small coverage area on the substrate, a stationary gun(s) may provide desired coating uniformity.

Deposition zones 30, 32, and 32 may be temperature controlled, such as by temperature controller 26 or other temperature control mechanism, to manage the mechanical stress of the deposited materials or the workpiece and/or some other physical properties of the deposited materials (such as a reduction of the electrical resistivity of the deposited metallic layers and/or the electrical contact resistance of the spray deposited metal on a pre-existing patterned metal layer) by adjusting the temperature of the workpiece (for example by heating the workpieces during the spray deposition process) when the materials are deposited. The temperature in different spraying zones (deposition zones) may be the same or different depending on the material being deposited and the desired physical and electrical properties. For a multi-layer metal spray process, the zone temperatures may be in the range of room temperature up to several hundred degrees C. Additionally, a heating or cooling zone 38 at the entrance of the atmospheric regions may be used to adjust the temperature of the workpiece before entering the deposition zones.

In one metallization example for a solar cell utilizing a backplane onto which metallization is formed, the last or second to last coating may be a thin coating of a solderable material, such as an aluminum-zinc alloy or pure zinc and/or tin or a suitable solder alloy, suitable for subsequent interconnection during solar module fabrication. Other examples for this last coating material include known solders such as Sn, Zn or alloys of Sn with metals such as Ag, Cu, Bi, Zn or Pb. A diffusion barrier may also be deployed as one of the coatings (unless both the top and pre-existing bottom metallization layers are made of the same non-lifetime-degrading element such as aluminum).

The starting deposition metal may fulfill at least two criteria: 1) to provide good adhesion to the underlying substrates, for example the substrate may be a polymer such as an epoxy based prepreg on a thin absorber solar cell; and 2) to provide a low resistivity ohmic contact to the underlying metal to which contact is made, for example through metallization of backplane vias that are machined into a polymer substrate by, for example, laser drilling. An additional requirement may be to not degrade the planarity of the substrate after deposition due to excessive stress of the sprayed metallization layer.

In a solar cell structure where there is no underlying metal in the vias, the first metal should make good ohmic contact directly to the semiconductor of the solar cell. The main current carrying coating may be thermal or arc spray aluminum, also known as TSA, with a layer thickness in the range of approximately 5 to more than 100 microns for certain back-contact (interdigitated back-contact or IBC) cell architectures. The optimum thickness and hence conductivity of the sprayed aluminum layer is governed by the size of the back-contact cell (i.e., larger cells typically require thicker aluminum to maintain minimal ohmic losses during current extraction from the cell) and the maximum allowed ohmic losses by the cell metal interconnects.

Representative metallization structures, for example for use in back contact solar cells, include but are not limited to, the following sprayed metal stack layers along with the designated sprayed metal thicknesses:

Two-Stage Spray Coating System: (1) Aluminum (in the range of approximately 5 microns to over 100 microns) used as the main high-electrical conductivity cell interconnect, (2) Zinc or Zinc-Al alloy used as a solder wetting surface to create a solderable surface on bulk Aluminum layer (~1 micron to 20 micron layer).

Three-Stage Spray Coating System: (1) Aluminum (in the range of approximately 5 microns to over 100 microns) used as the main high-electrical conductivity cell interconnect, (2) Zinc or Zinc-Al alloy used as a solder wetting surface to create a solderable surface on bulk Aluminum layer (~1 micron to 20 micron layer), (3) Solder, such as a tin-based solder, (~1 micron to 20 micron layer) used as a solderable surface and protective layer over zinc or zinc alloy.

Four-Stage Spray Coating System: (1) Adhesion and low-resistance contact layer of Zinc or Zinc-Aluminum alloy (~1 micron to 20 micron layer), (2) Aluminum (in the range of approximately 5 microns to over 100 microns) used as the main high-electrical conductivity cell interconnect, (3) Zinc or Zinc-Al alloy used as a solder wetting surface to create a solderable surface on bulk Aluminum layer (~1 micron to 20 micron layer), (4) Solder, such as a tin-based solder (~1 micron to 20 micron layer) used as a solderable surface and protective layer over zinc or zinc alloy.

Other metal stacks, such as those utilizing copper instead of aluminum, are also possible. Representative examples of metallization stacks using sprayed copper, for example for use in back-contact solar cells including back contact solar cells comprising laminated backplanes, include but are not limited to:

One-Stage Spray Coating System: (1) Copper (in the range of approximately 5 microns to over 100 microns) used as the main high-electrical conductivity cell interconnect.

Two-Stage Spray Coating System: (1) Initial layer of Aluminum (~1 microns to over 10 microns) used as the interfacial contact and barrier layer, (2) Copper (in the range of approximately 5 microns to over 100 microns) used as the main high-electrical conductivity cell interconnect.

Three-Stage Spray Coating System: (1) Initial layer of Aluminum (~1 microns to over 10 microns) used as the interfacial contact and barrier layer, (2) Copper (in the range of approximately 5 microns to over 100 microns) used as the main high-electrical conductivity cell interconnect, (3) Solder, such as a tin-based solder (~1 micron to 20 micron layer) used as a solderable surface and protective layer over copper.

Among other materials, combinations of sprayed metal stacks comprising either aluminum or copper as the main high-conductivity electrical interconnect and metallization layer may also be used.

Metal sources may be a controlled feed of single or twin wires melted in an arc plasma and transported using air or a non-oxidizing (inert or reducing) gas ambient to the surface of the workpiece. In another embodiment, the metal sources may be powders that control fed into a plasma ambient and then transported by a gas ambient to the surface of the workpiece. For example, powders may consist of pure metals, mixtures of powders of different metals, or powders of alloyed metals depending on how the powder itself is generated. Utilizing powders as a metal source may allow for the deposition of metal in close proximity to the substrate surface and thus allow for the deposition of finer features of smaller dimensions (for example down to a few microns wide). The proper particle sizing and size selection of the powders is a significant component of such selection. Examples of metals and alloys that may be used as powders include but are not limited to Cu, CuSn, Al, AlZn, Zn, Sn, ZnSn, Ni, etc. including solderable materials.

Deposition of finer metallization features allows for metallization schemes, formed in conjunction with direct writing (for example by using a plurality of non-contact proximity injection nozzles) or with shadow masked writing of metals, of, for example: alternating emitter and base lines for a back contact cell design positioned directly on the cell; and contacting the terminal contact areas on a cell such as the emitter and base contacts, and for contacting the second layer of metal in cell designs which contain two or more levels of metal (for example where the two levels of metal are separated by a dielectric which has local openings such as inter-level vias) to allow for local contacting between the separate metal layers (for example between a first metal layer and a second metal layer such as metal 1 and metal 2 herein). In the latter case of a two level metal design, it may reduce cost and improve cell performance to have the first level metal, which contacts the active areas of the cell, designed with finer features (for example the finer pitch in an interdigitated back-contact metallization pattern) than the second level metal, which connects to the first level and to the module connector level, and which may have coarser features (for example, a structure using an orthogonal transformation of the second level metal compared to the first level metal—in other words the metal 2 fingers run substantially perpendicular to the metal 1 fingers).

For example, solar cell designs and manufacturing processes described herein may have two levels of metallization which are separated by an electrically insulating layer, also called a backplane layer, which is laminated on or attached to or deposited onto the backside of a substrate. In formation embodiment, prior to backplane lamination, the solar cell base and emitter contact metallization pattern is formed directly on the cell backside, for example by using a thin layer of screen printed or plasma sputtered (PVD) aluminum (or an aluminum silicon alloy) material layer. This first layer of metallization (herein referred to as M1) may define the solar cell contact metallization pattern, such as fine-pitch interdigitated back-contact (IBC) conductor fingers defining the base and emitter regions of the IBC cell. The M1 layer serves as contact metallization of the solar cell, in other words it extracts the solar cell current and voltage and transfers the solar cell electrical power to the second level/layer of higher-conductivity solar cell metallization (herein referred to as M2) formed after M1, through inter-level conductive via plugs (also formed along with the M2 layer). After formation of the backplane (including formation of the via holes), the higher conductivity layer M2 layer is formed on the backplane (for example M2 may have a higher current-carrying electrical conductivity as compared to M1). Via holes (in some instances up to hundreds or thousands of via holes) are drilled into the backplane (for example by laser drilling), or formed along with the backplane formation (pre-patterned with the backplane formation). These via holes land on pre-specified regions of M1 for subsequent electrical connections between the patterned M2 and M1 layers through conductive plugs formed in these via holes. Subsequently, the patterned higher-conductivity metallization layer M2 is formed (for example by plasma sputtering, plating, or a combination thereof—for example using an inexpensive and high-electrical-conductivity M2 material comprising aluminum and/or copper). For an interdigitated back-contact (IBC) solar cell with fine-pitch IBC fingers on M1 (for instance, hundreds of M1 metallization fingers per cell), the patterned M2 layer may be designed orthogonal to M1—i.e., the M2 fingers are essentially perpendicular to the M1 fingers. Because of this orthogonal transformation, the M2 layer may have far fewer IBC fingers than the M1 layer (for instance, by a factor of about 10 to 50 fewer M2 fingers). Hence, the M2 layer may be a much coarser pattern with much wider IBC fingers than the M1 layer. Solar cell busbars may be positioned on the M2 layer, and not on the M1 layer, to eliminate electrical shading losses associated with busbars on a solar cell. And as both the base and emitter interconnections and busbars may be positioned on the M2 layer on the solar cell backside backplane, electrical access is provided to both the base and emitter terminals of the solar cell on the backplane.

The backplane material may be a thin sheet of an inexpensive polymeric material with sufficiently low coefficient of thermal expansion (CTE) to avoid causing excessive thermally induced stresses on the thin silicon layer. Moreover, the backplane material should meet process integration requirements for the backend cell fabrication processes, in particular chemical resistance during wet texturing and cleaning of the cell frontside and thermal stability during the PECVD deposition of the frontside passivation and Anti-Reflection Coating (ARC) layer. The electrically insulating backplane material should also meet the module-level lamination process and long-term reliability requirements. While various suitable polymeric (such as plastics, fluoropolymers, prepregs, etc.) and suitable non-polymeric materials (such as glass, ceramics, etc.) may be used as the backplane material, backplane material choice depends on many considerations including, but not limited to, cost, ease of process integration, reliability, pliability, etc.

A suitable material choice for backplane is a relatively low-CTE prepreg. Prepreg sheets are used as building blocks of printed circuit boards (with a wide range of applications in other areas) and may be made from combinations of resins and CTE-reducing and reinforcing fibers or particles. The backplane material may be an inexpensive, low-CTE (typically with CTE<10 ppm/° C., or with CTE<5 ppm/° C.), thin (usually in the range of approximately 50 to 250 microns) prepreg sheet which is relatively chemically resistant to texturization chemicals and is thermally stable at temperatures up to at least 180° C. (or at least to as high as about 280° C.).

If powder instead of wire is the metal source (for example a powder with particle sizes from submicron up to several microns), a plurality of active nozzles, either in a monolithic nozzle block or in an array of nozzles, may deposit metal on the substrate surface in parallel and concurrently. Further, the metal powder feed may be separated or combined for nozzle and feed equipment simplicity and cost reduction. Metal deposition may be continuous or intermittent (for instance, for segmented metallization lines and/or controlling the length of the directly written metal fingers), the latter by turning of the metal feed (wire or powder), by turning off the nozzle, or both.

Figure 2A:
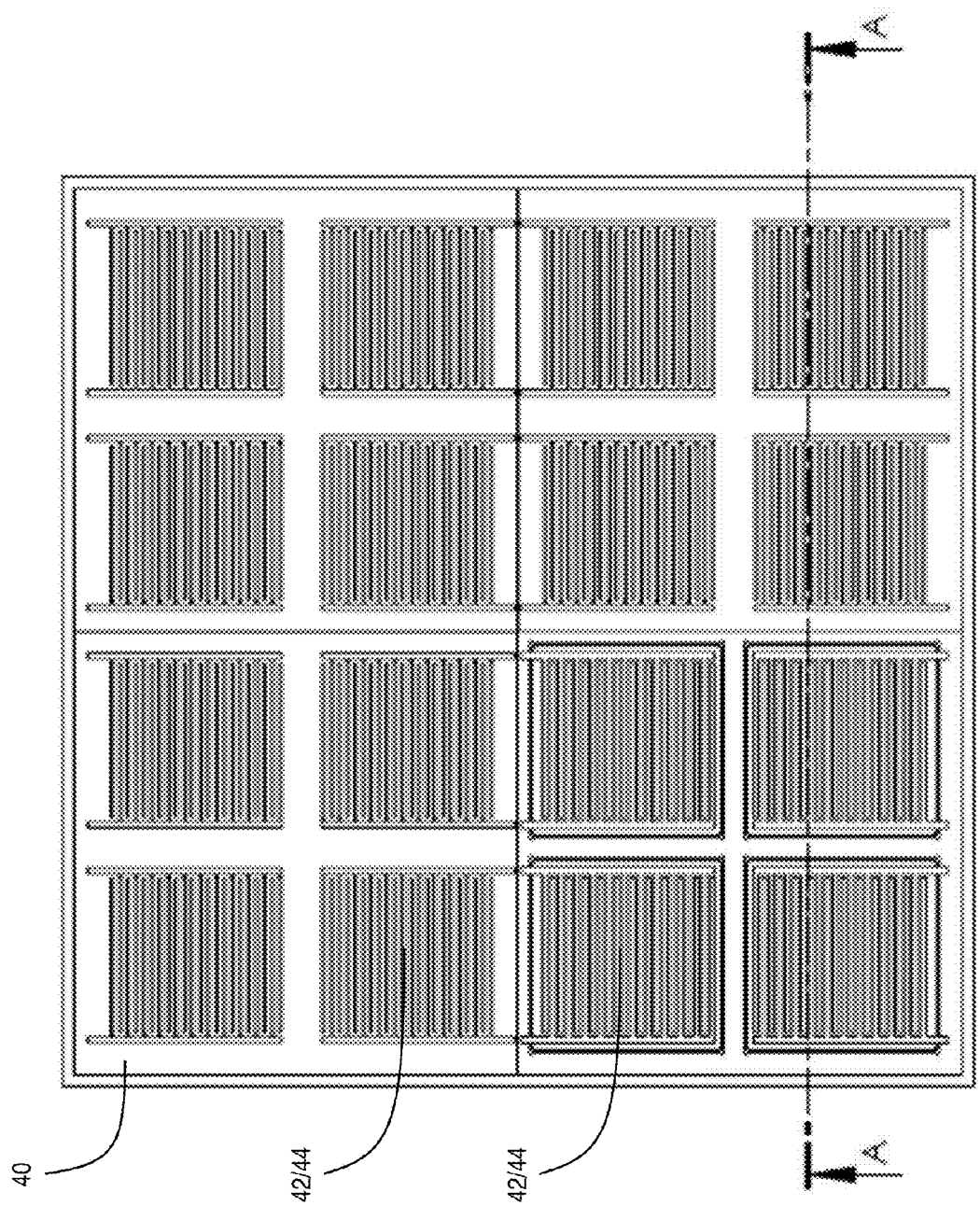

FIG. 2A is a diagram showing a top view of an example carrier/workpiece/mask assembly, FIG. 2B is a diagram showing the A-A cross section of the carrier/workpiece/mask assembly of FIG. 2A, and FIG. 2C is an expanded selection of FIG. 2B. Workpieces 42 are placed on carrier 40 and covered by shadow mask plate 44 as shown. The shadow mask plate may be in contact or placed in close proximity to the workpieces. The workpiece carrier and masking plate shown in FIG. 2A is for 16 substrates arranged in a 4×4 array, however, various other N×M workpiece arrangements are also possible (where N and M are integers).

In one embodiment, metal (for example metal such as metal wire or powder made of aluminum, alloy of aluminum with silicon—to reduce junction spiking when used as first level metal in contact with silicon, zinc, solder, and/or an alloy comprising aluminum and zinc, as well as combinations of copper, tin, tin-zinc alloys) fed to the spraying guns may be stopped between successive workpiece carrier trays and/or when workpiece carrier trays are not in coating areas so that the conveyor belt is not sprayed with undesirable coating and to avoid the waste of metals. This arrangement to maximize effective utilization of the sprayed metal layers may be controlled by the system control based on the relative positions of the trays compared to the spraying guns. For example, by sensors in the deposition machine that detect the presence of workpieces or workpiece carrier trays and coupling this signal to the spray apparatus.

The in-situ shadow masking plates may be removed, for example for a blanket coating of spraying materials, while the workpieces transported via the carriers to prevent spraying of the coating materials onto the conveyor belt. In yet another embodiment, workpieces may be placed directly onto the conveyor belt and the belt may be chemically cleaned during its return path to transport another cycle of workpieces through the processing machine. And in yet another embodiment, each workpiece may be pre-assembled with an individual shadow mask and the masked workpieces may be placed directly onto the conveyor belt and the conveyor belt may be chemically cleaned during its return path to transport another cycle of workpieces through the processing machine in a wet etching or vapor phase etching chamber separate from the thermal and/or arc spray chamber.

In another embodiment, for example to form a metallization pattern of an array of coarser-pitch linear parallel lines, such as an array of linear parallel lines (for forming interdigitated M2 emitter and base fingers) arranged orthogonally to underlying finer-pitch prior M1 metal layer lines in a 2-level metal configuration separated by an insulating layer, metal strips or wires may be used for in-situ masking and patterned deposition of M2 layer. For example, feeding a parallel array of separating masking metal strips or wires into the processing machine, for example inserted synchronized to the movement of the conveyor belt or other transport system carrying the substrates through the metal deposition system, for use as shadow masks. Further, masking strips or wires, for example arranged in meshes, may be used to create metallization patterns other than a parallel pattern. In another example, the alignment of the workpiece may be adjusted or rotated, during processing or in multiple processing cycles, to create a pattern having intersecting lines (for example lines at 90 degree intersections which may be useful to form busbars). Mobile continuous strips as described above may be arranged in a roll to roll arrangements as shown in FIGS. 3 and 4.

Figure 3:
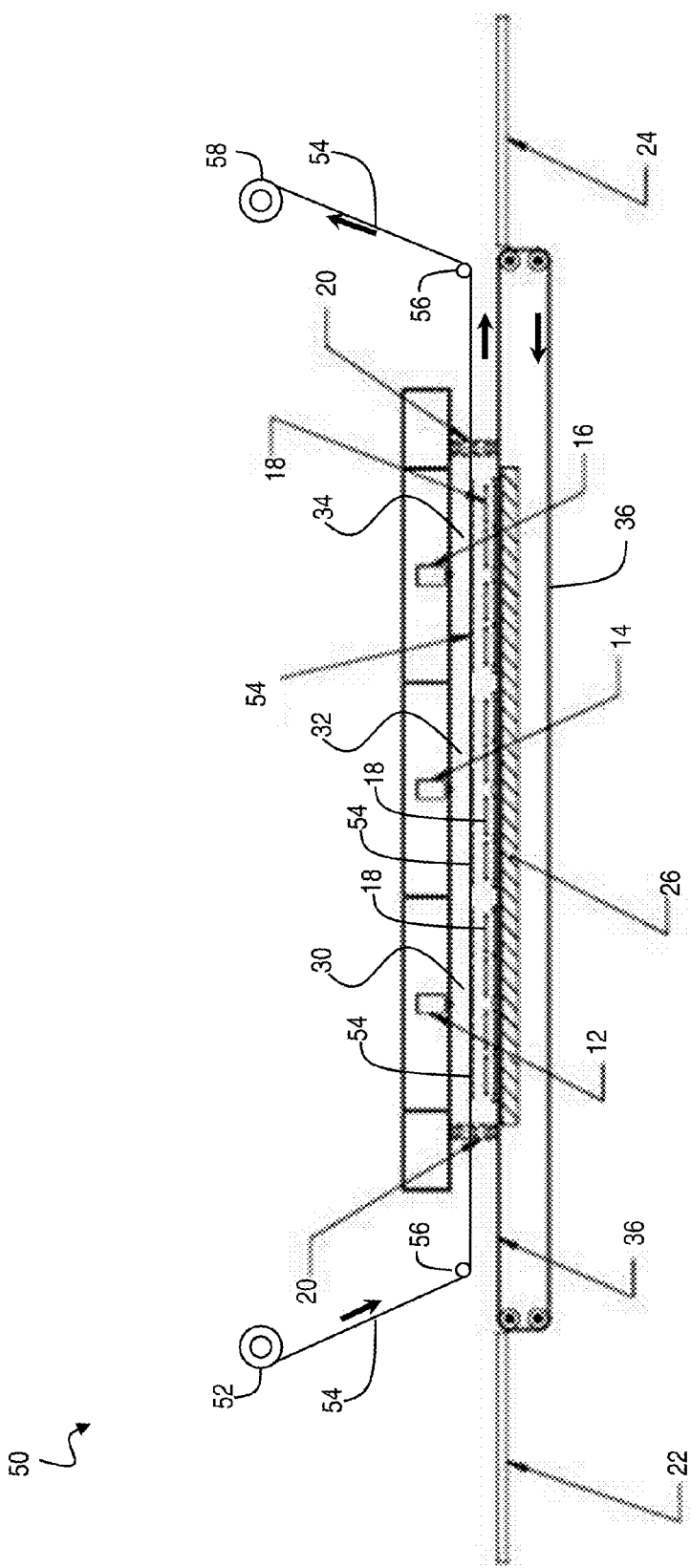
FIGS. 3 and 4 are diagrams showing automated processing equipment for the application of deposition of metal coatings onto a series of substrates carried.
Figure 4:
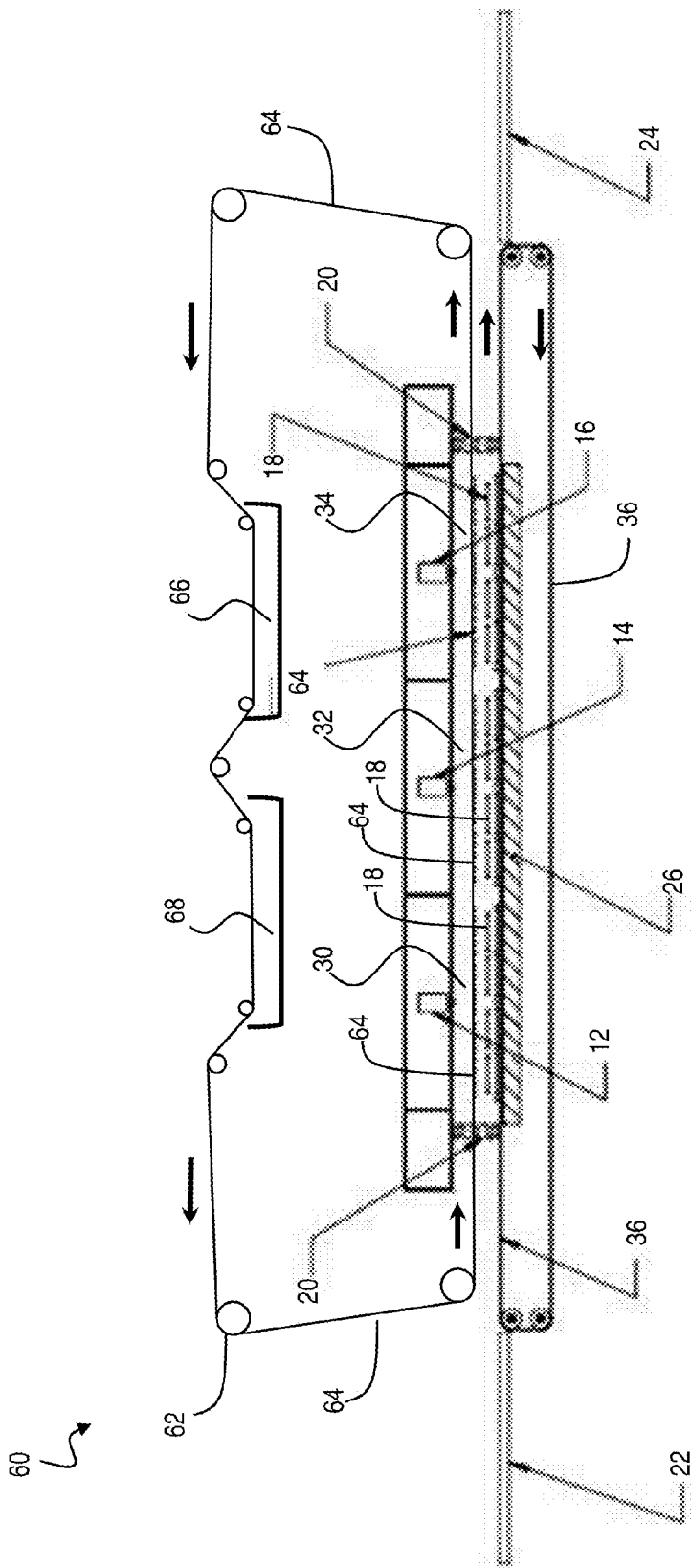

FIGS. 3 and 4 are diagrams showing automated processing equipment for the application metal coatings onto a series of substrates carried in carriers, similar to automated processing machine 10 shown in FIG. 1, using strips or wires for masked patterning (in contrast to the masked carriers 28 shown FIG. 1). Automated processing machine 50 in FIG. 3 shows a system using a roll-to-roll strips arrangement and automated processing machine 60 in FIG. 4 shows a system using a continuous (or endless roll) strips arrangement.

The automated atmospheric-pressure processing equipment for application of metal sprays to workpieces carried in carriers and masked using an arrangement of parallel wires or strips in a roll-to-roll arrangement shown in FIG. 3. Examples of roll-to-roll strips are detailed in FIGS. 5A and 5B. Automated processing machine 50 in FIG. 3 comprises a roll-to-roll arrangement for rolling segmented wires or strips 54 from roll 52 through deposition zones 30, 32, and 32 to roll 58. Guide rollers 56 help guide and position the segmented wires or strips 54 in the deposition zones and may also provide tension.

Segmented wires or strips 54 act as shadow masks for metallization patterning on substrates (workpieces) 18 in the deposition zones. The segmented wires or strips may be attached and aligned with the workpieces using magnetic or electrostatic chucking through the workpiece. And in the case of coarse metallization features with minimum dimensions on the order of several millimeters, by placing and retaining the masking strips or masking plates at a controlled vertical distance from the substrate (proximity shadow masking), for example by using spacers which can be part of the tray, or by tensioned guide rollers (such as guide rollers 56) that position the strips at a defined distance above the substrate.

Automated processing machine 60 in FIG. 4 is designed for the application of metal sprays (comprising aluminum, zinc, zinc/aluminum alloy, solder, copper, etc.) to workpieces carried in carriers and comprises an endless feed arrangement of parallel wires or strips with in-situ cleaning of the wires or strips. Segmented wires or strips 64 are rotated through deposition zones 30, 32, and 32 using guide rollers 62. After use as a shadow mask in the metallization processing in deposition zones 30, 32, and 32, segmented wires or strips 64 are passed through etching/cleaning segment 66 and rinsing/drying segment 68 before being used in another metallization cycle.

Figure 5A:
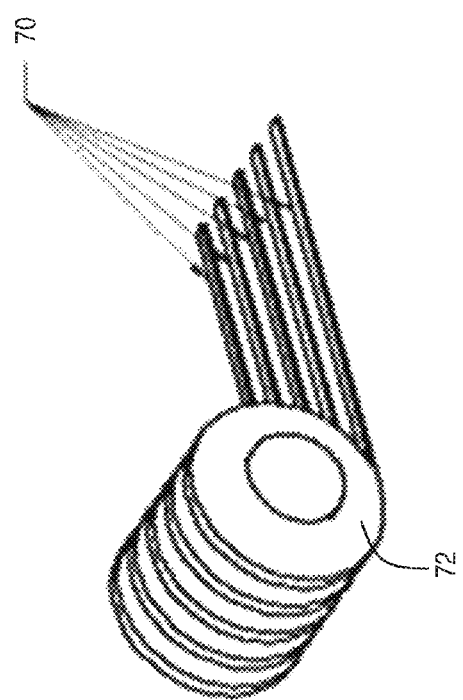
FIGS. 5A and 5B are diagrams showing a roll of segmented wires or strips and a guide roller guiding segmented wires or strips for use as in-situ shadow masks used for formation of a patterned metallization layer using thermal spray coating of metals on a workpiece in accordance with the disclosed subject matter, respectively.
Figure 5B:
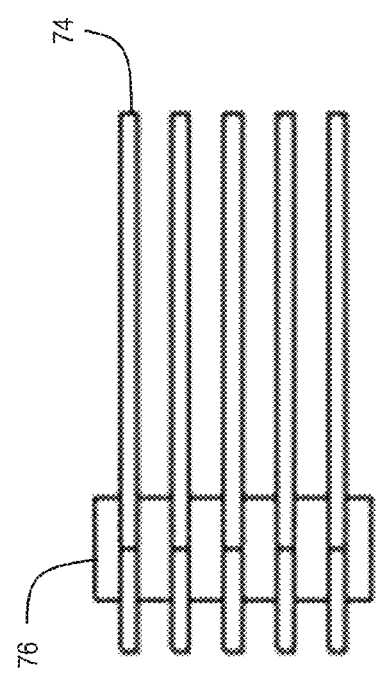

FIGS. 5A and 5B are diagrams showing a roll of segmented wires or strips and a guide roller guiding segmented wires or strips for use as shadow masks in the thermal spray coating of metals on a workpiece, respectively. FIG. 5A shows segmented wires or strips 70 on roll 72 similar to segmented wires being rolled from roll 52 or onto roll 58 in FIG. 3. FIG. 5B shows segmented wires or strips 74 on guide roller 76 similar to segmented wires guided on guide rollers 56 and guide rollers 62 in FIGS. 3 and 4, respectively.

In a variation of disposable shadow masks, a parallel array of tape material (such as inexpensive paper materials which may be economically advantageous) that can withstand the impact of the metallization spray may be attached to the substrate prior to deposition forming the desired pattern and removed after deposition, carrying with it the metal from areas where metal coverage is not desired. This type of processing may require an especially good metal to substrate adhesion such that tearing of the metal during the tape removal process does not cause excessive metal delamination from the underlying substrate which could lead to device reliability issues.

Two distinctions described above for in-situ-masked patterning are discrete masks that may be arranged with substrates in a batch tray (such as that shown in FIG. 1) or strips/wires that are arranged in a roll-to-roll design (such as that shown in FIG. 3) or endless/continuous roll design (such as that shown in FIG. 4). In both cases—whether discrete masks or strips/wires masks are used—the shadow mask material may be an economic material discarded after a single coating or set number substrate coatings. The shadow mask material may also be a material that may be re-used numerous times by cleaning off the metallization material (e.g., aluminum, zinc, and/or solder) deposited onto the masking material during the thermal spray/arc process. The mask cleaning process may be chemically selective (i.e. not damaging to the mask material) and in situ, or in other words integrated with the metal spray equipment as part of the spray coating machine, for example in systems where the masking plates or strips/wires are fed straight back to the beginning of the machine (as shown in FIG. 5). In a closed-loop arrangement, the conveyor belt and/or batch trays may be chemically cleaned in real time on their return path after unloading the processed workpieces and before loading the next batch of workpieces (again, as shown in FIG. 5). Alternatively mask cleaning may be performed in a separate cleaning system, for example by selective chemical removal of the thermally sprayed material from the mask (and supporting conveyor trays) or by other methods such as grit blasting, thermal shock blistering or mechanical abrasion of the material, or a combination thereof.

Figure 6:
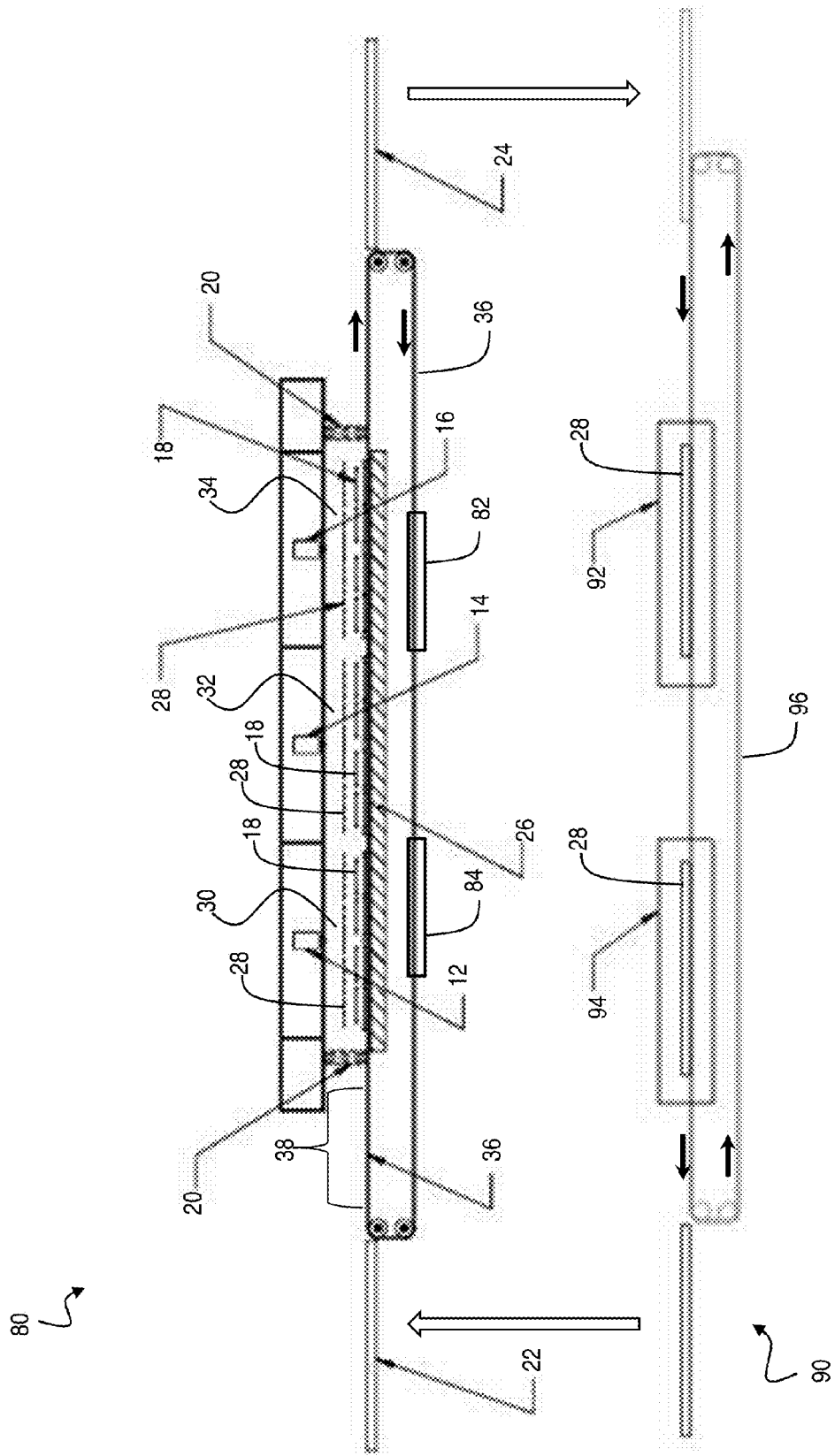
FIG. 6 is a diagram showing automated processing equipment for the application metal coatings onto a series of workpieces carried.

A combination of discrete masking and continuous masking may utilize a masking plate movement synchronized to the workpiece transport system movement in conjunction with an apparatus part of the coating system which removes the masking plates from the substrate tray or tray chain after the finished deposition cycle, feeds the masking plates through an internal cleaning cycle and then directly back to the input side of the metal deposition system to be used again for the next metallization pass (an embodiment of which is shown in FIG. 6).

FIG. 6 is a diagram showing automated processing equipment for the application metal coatings onto a series of workpieces carried in masked carriers, similar to automated processing machine 10 shown in FIG. 1, with in-situ (or tool integrated) cleaning and recycling of carriers and masks. As described above, tray/mask clean and cycling system 90 is integrated with automated processing equipment 80 to remove and clean masks 28 after a metallization processing cycle and feed them back to automated processing equipment 80 for another metallization processing cycle. As shown, masks 28 are moved through clean and etch segment 92 to rinse and dry segment 92 by transport system 96 (for example a conveyor belt).

Figure 7:
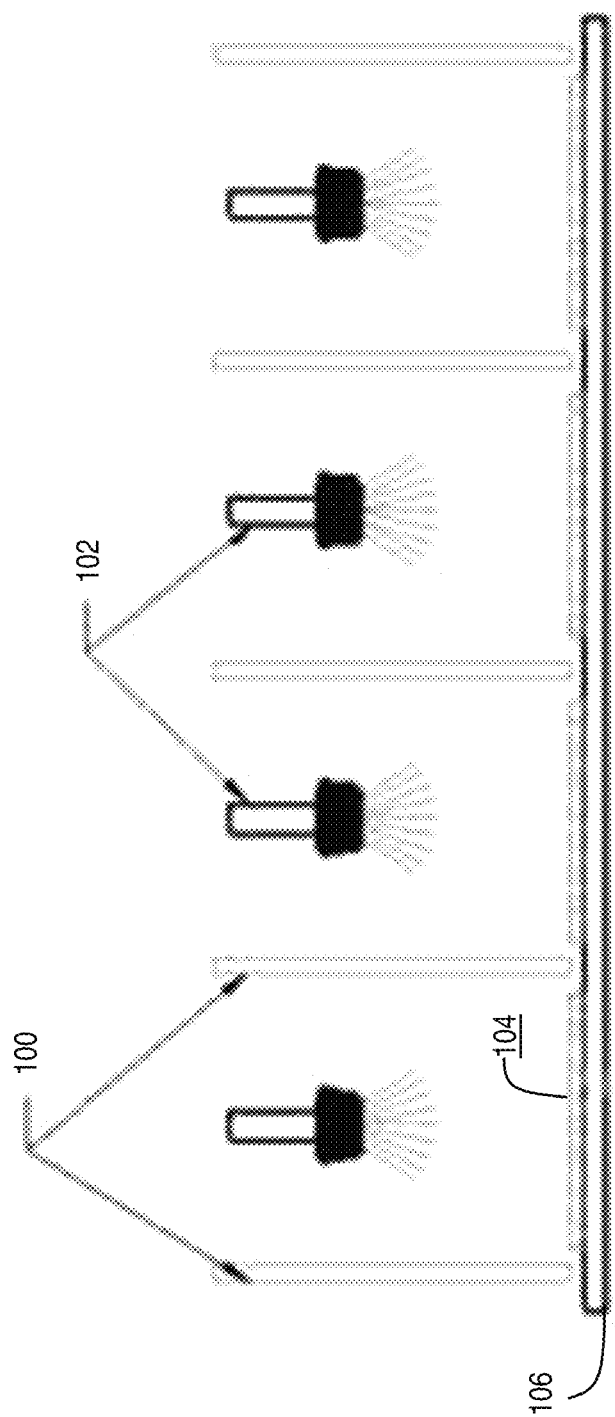
FIG. 7 is a diagram showing an array of spray nozzles with separation walls.

When coarse metallization alignment patterns with metal pattern minimum dimensions on the order of several millimeters are required (for example for orthogonally aligned backplane metallization for a back-contact IBC solar cell comprising two levels of metallization), such patterned metallization may be formed without contact or proximity masking but rather by positioning a parallel array of thermal spray heads close enough to the substrate and with a spray characteristic for the spraying of the desired pattern without overlapping sprays (for example without unintended conductive paths between adjacent parallel lines in a parallel line pattern). Unintended over-spraying may also be avoided by charging the spray beam electrically while having a coarse grid of shielding walls between nozzles, in areas where spraying/metallization is not desired. The shielding walls may also be charged with the same polarity as the spray beam—thus repelling spray particles and assisting in separating parallel spray lines. FIG. 7 is a diagram, as described above, showing a system using an array of spray nozzles with shielding creating separation to form individual spray deposited metal lines in a metal lines pattern on a workpiece. As shown in FIG. 7, individual spay heads 102, separated by electrically charged separation walls 100, and which spray an electrically charged spray beam to form spray deposited metal lines 104 on substrate 106.

Tool architecture has been described above using a conveyor belt transport system (in-line deposition system) to move the substrates (or trays holding the substrates) through the deposition and heating zones. Alternative transport systems may also be used, including, for example, a rotary feed of substrates or substrates in trays between substrate loading zones, process zones, unloading zones (which could double as loading zones) and tray, mask and handling system cleaning zones.

Further, the presented processes have been described in reference to all-dry process on the substrate using a contact or proximity shadow mask during the metal spray deposition. Alternatively, it is also possible to use a combination of processes, for example but not limited to the following:

The bottom metallization layer or layers (for example a main high-electrical conductivity aluminum metallization layer followed by a zinc adhesion layer) may be deposited in a blanket fashion using thermal spraying without the use of contact or proximity shadow masks. The top metallization layer or layers (for example a top solder layer) may be subsequently deposited in a patterned fashion, for example by patterned screen printing. The top metallization layer(s) may then be subsequently used as an etching mask to remove the underlying bottom layer(s), for example using a selective wet or dry etching chemistry which etches only the bottom layer(s) while not etching the top layer(s) and other parts of the substrate. For example, aluminum or aluminum zinc alloys may be used as one of the bottom layers and solders may be used as one of the top layers with selective etch chemistry comprising mixtures between phosphoric and acetic acid, or alternatively potassium, or sodium hydroxide to etch off the aluminum or aluminum zinc alloys.

An alternative example to pattern a blanket sprayed film on the substrate is to use an array of grinding or otherwise abrasive wheels that locally remove the deposited metal where not desired.

Figure 8:
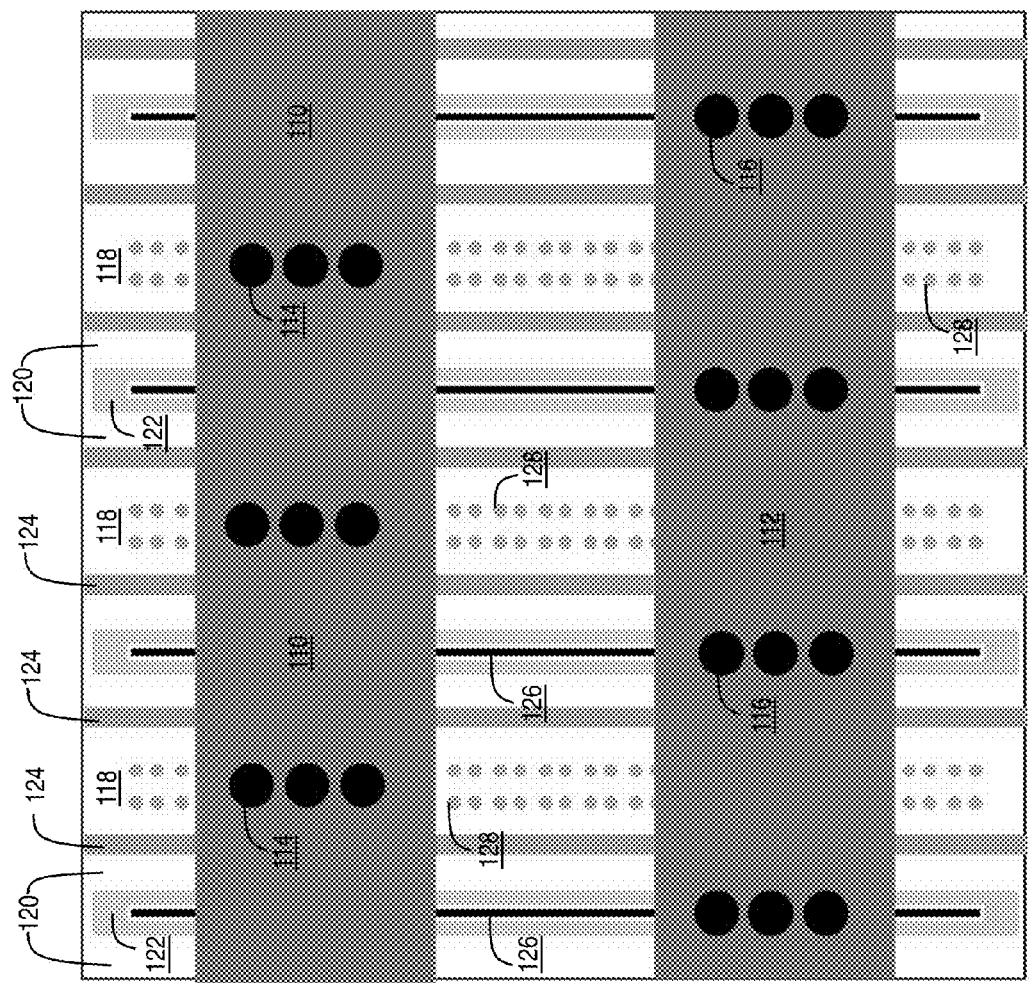
FIGS. 8-10 are diagrams illustrating example embodiments for the application of atmospheric sprayed metal layers.
Figure 9:
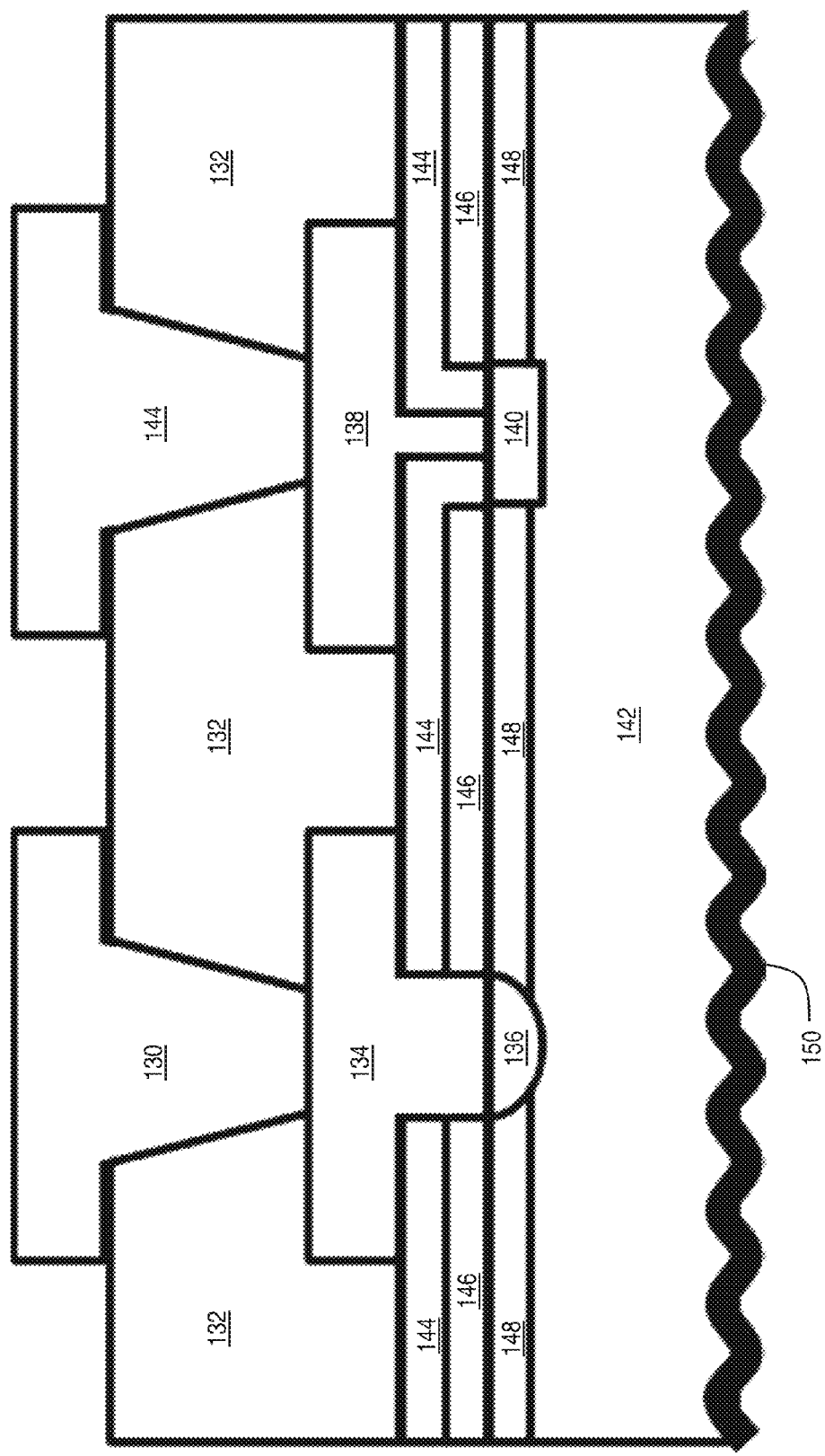
Figure 10:
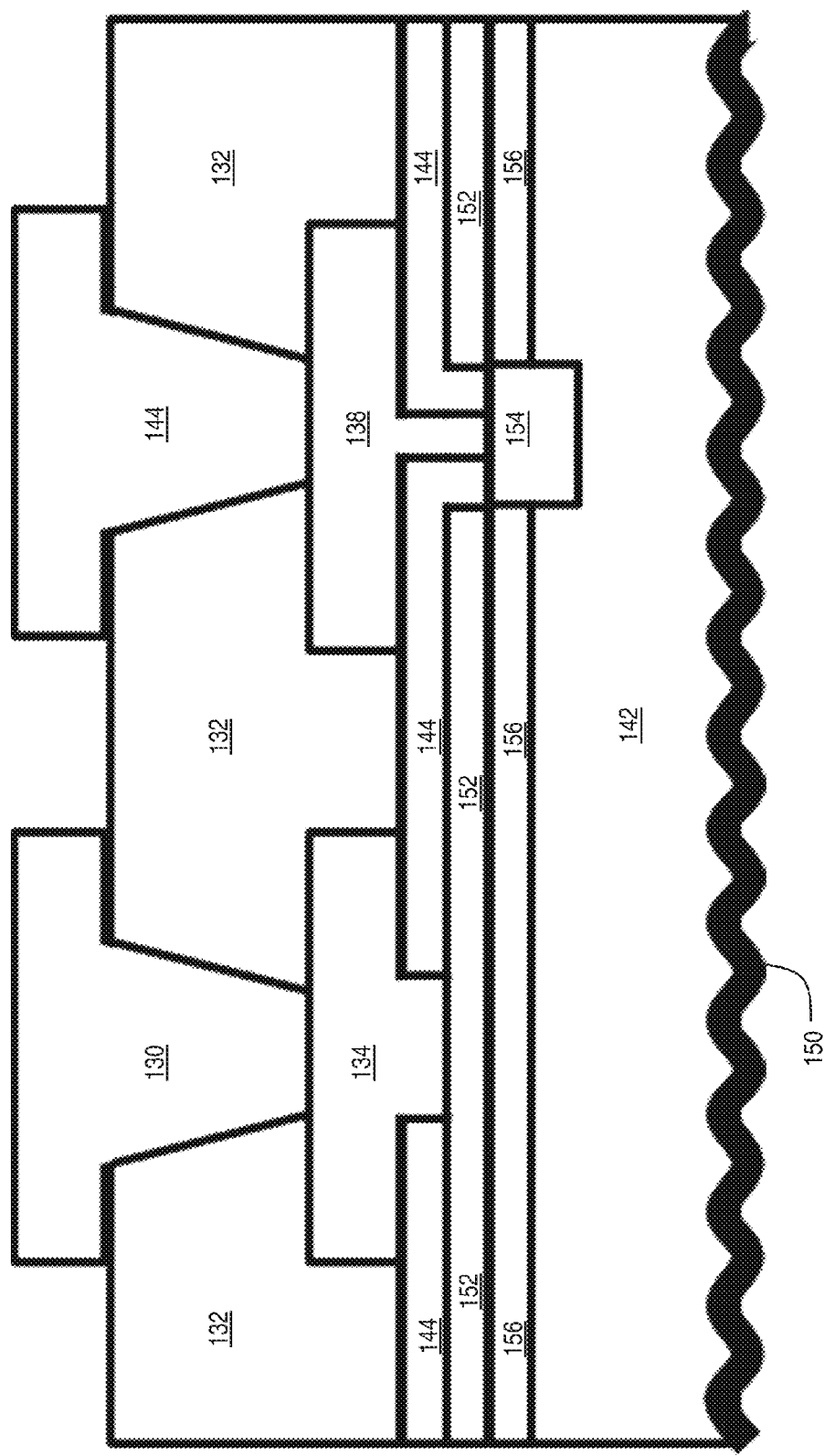

FIGS. 8 through 10 are diagrams illustrating example embodiments for the application of atmospheric sprayed metal layers, with metal sources provided to the spray apparatus from fed wires, powders or otherwise, for back contact solar cell designs. The metallization patterns of FIGS. 8 through 10 use thermally sprayed metals or metal alloys for the first layer metal metal 1 (the sprayed feature size is kept small) as well as for the second layer metal metal 2 for which the design rules and feature sizes may be relaxed and coarser (in other words wider metallization lines and spaces). And while FIGS. 8-10 illustrate back-contacted IBC cells with two levels of metal (each containing one or more metals or alloys), the methods and systems disclosed herein may also apply to a single metal level back contacted cell, as well as front- and back-contacted solar cells. The applications of the embodiments of this invention are not limited to solar photovoltaics and include application to other fields including but not limited to semiconductor microelectronics, flat-panel displays, optoelectronics, and MEMS devices.

FIG. 8 is a diagram showing a top view of a back contact solar cell illustrating an orthogonal pattern transfer using high conductivity metal fingers spray deposited (for example in a direct write pattern to reduce mask associated costs) or plated on top of a backplane dielectric layer (backplane layer not shown to detail underlying metal 1 pattern). Metal 1 pattern comprises first level metal emitter fingers 118 (for example thermally sprayed, screen printed, or PVD deposited/laser ablated metal base fingers) and first level metal base fingers 120 (for example thermally sprayed, screen printed, or PVD deposited/laser ablated metal emitter fingers). First level metal emitter fingers 118 contact underlying solar cell emitter regions through multi-level contact openings trenches 122 and trenches 126, and first level metal base fingers 120 contact underlying solar cell base regions through holes 128. Second level metal emitter contact fingers 110 (for example plated Cu or thermally sprayed metal) contacts first level metal emitter fingers 118 through emitter holes 114 (for example drilled via holes) in the backplane positioned between the first and second metallization layers. Second level metal base contact fingers 112 (for example plated Cu or thermally sprayed metal) contacts first level metal base fingers 120 through base holes 116 (for example drilled via holes) in the backplane positioned between the first and second metallization layers.

FIG. 9 is a diagram showing a cross sectional view of a homojunction back contact solar cell supported by a backplane and having parallel metallization layers. Note that this structure shows parallel metal 1 and metal 2 as opposed to the orthogonal structure shown in FIG. 8. The back contact cell of FIG. 9 comprises silicon substrate 142 (for example an epitaxial silicon substrate or a wafer formed silicon substrate), shown as an n-type base, with front surface texture passivation layer 150. Front surface texture passivation may comprise textured structures, such as randomly textured pyramids, optionally with a front surface field surface covered with a passivation layer (for example thermal oxide plus silicon nitride, or amorphous silicon (a-Si)/SiN, or amorphous silicon oxide (a-Si—O)/SiN, or intrinsic amorphous silicon (i-a-Si), or intrinsic amorphous silicon oxide (i-a-Si—O)/n-type amorphous silicon (n-a-Si)/SiN. First level metal emitter contact 134 contacts p+ emitter layer 148 at p++ emitter contact 136 and first level metal base contact 138 contacts n-type silicon substrate 142 at n+ base contact 140. Boron silicate glass layer 148 and phosphorous silicate glass layer 146 are used cell doping processing during back contact cell fabrication. Backplane 132 is formed between the first level metallization pattern comprising first level emitter contacts 134 and first level base contacts 138 (for example Al, AlSi, or thermally sprayed Al, AlSi, Al+Zn) and second level metallization pattern comprising second level emitter contacts 130 and second level base contacts 144 (for example thermally sprayed Al with Al/Zn). The first level metallization pattern and second level metallization pattern contacted through vias/holes formed in the backplane (for example by a laser drilling process).

FIG. 10 is a diagram showing a cross sectional view of a heterojunction back contact solar cell supported by a backplane and having parallel metallization layers similar to the homojunction cell shown in FIG. 9 except that first level metal emitter contact 134 contacts p++ emitter layer 152 (for example a poly-SiGe emitter layer) positioned on dielectric layer 156 (for example an a-Si on tunnel dielectric layer) and first level metal base contact 138 contacts n+ base contact 154 (for example laser doped).

The metallization contacts shown in FIGS. 9 and 10 may be formed in line patterns as shown in FIG. 8. The sprayed metal lines, particularly for the first level metal, may contain the same metal, alloy, or metal stack, or alloy stack for both the emitter and the base contact. However, same level emitter contact metal and base contact metal may be different. Further, same level emitter contact metal and base contact metal may sprayed in consecutive passes by transporting the workpiece to subsequent spray deposition stations or in the same pass by using dedicated nozzles with different metal or alloy sources. For consecutive spray deposition, intermediate thermal processing may be used. Final thermal processing after metallization as well as thermal treatment during the spray application may be used to reduce built-in stress in the resulting sprayed workpiece and thus improve metal layer adhesion and reduce workpiece bow. It may also be possible to directly write the metal lines or patterns on the substrate by writing multilayer structures (for example, a first layer of metal comprising aluminum contacting the solar cell base and emitter regions followed by top layer made of aluminum-zinc alloy for lower contact resistance with the second level metal, metal 2, through the vias).

While the embodiments described herein have been largely explained in conjunction with back-contact/back-junction crystalline silicon solar cells using very thin (e.g., from a few microns up to about 100 microns) mono-crystalline silicon absorber layers supported on backplanes, it should be understood that the aspects of the disclosed subject matter may be applied to other solar cell and module implementations by one skilled in the art, including but not limited to the following: front contact solar cells and PV modules comprising such cells; non-crystalline silicon solar cells and modules such as those made from crystalline GaAs, GaN, Ge, and/or other elemental and compound semiconductors; and, wafer-based solar cells including back-contact/front-junction, back-contact/back-junction and front-contact solar cells made from crystalline semiconductor wafers (such as crystalline silicon wafers).

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. Processing equipment for the metallization of a plurality of semiconductor workpieces, comprising:
    a controlled atmospheric non-oxidizing gas region comprising at least two enclosed deposition zones, said controlled atmospheric non-oxidizing gas region isolated from external oxidizing ambient;
    a temperature controller adjusting the temperature of said semiconductor workpiece in each of said at least two enclosed deposition zones;
    each of said enclosed deposition zones comprising at least one spray gun for the metallization of said semiconductor workpiece;
    a transport system moving said semiconductor workpiece through said controlled atmospheric non-oxidizing gas region; and
    a batch carrier plate carrying said semiconductor workpiece through said controlled atmospheric non-oxidizing gas region gas region;
    wherein said controlled atmospheric non-oxidizing gas region further comprises a pre-cleaning zone,
    wherein said pre-cleaning zone is a gas based pre-cleaning zone.

2. The processing equipment of claim 1, further comprising a shadow mask exposing and defining a metallization pattern on said semiconductor workpiece.

3. The processing equipment of claim 2, wherein said shadow mask is a discrete patterned mask positioned on said semiconductor workpiece.

4. The processing equipment of claim 2, further comprising an integrated mask cleaning system.

5. The processing equipment of claim 2, wherein said shadow mask are strips arranged in a roll-to-roll arrangement.

6. The processing equipment of claim 2, wherein said shadow mask are strips arranged in a continuous strips arrangement.

7. The processing equipment of claim 6, further comprising a strips cleaning segment.

8. The processing equipment of claim 1, wherein said controlled atmospheric non-oxidizing gas region comprises at least three enclosed deposition zones.

9. The processing equipment of claim 1, wherein said controlled atmospheric non-oxidizing gas region further comprises a pre-cleaning zone.

10. The processing equipment of claim 9, wherein said pre-cleaning zone is a gas based pre-cleaning zone.

* * * * *